US008421943B2

(12) United States Patent
Ono et al.

(10) Patent No.: US 8,421,943 B2
(45) Date of Patent: Apr. 16, 2013

(54) LIQUID CRYSTAL DISPLAY DEVICE HAVING A THIRD ELECTRODE FORMED OVER A SECOND INSULATING FILM AND OVERLAPPED WITH A PAIR OF GATE LINES

(75) Inventors: Kikuo Ono, Mobara (JP); Masahiro Tanaka, Mobara (JP); Yoshiaki Nakayoshi, Mobara (JP); Nobuyuki Suzuki, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 13/308,684

(22) Filed: Dec. 1, 2011

(65) Prior Publication Data

US 2012/0140137 A1 Jun. 7, 2012

Related U.S. Application Data

(63) Continuation of application No. 13/037,925, filed on Mar. 1, 2011, now Pat. No. 8,107,028, which is a continuation of application No. 12/562,636, filed on Sep. 18, 2009, now Pat. No. 7,907,225, which is a continuation of application No. 11/929,025, filed on Oct. 30, 2007, now Pat. No. 7,605,900, which is a continuation of application No. 11/338,853, filed on Jan. 25, 2006, now Pat. No. 7,375,786, which is a continuation of application No. 10/990,497, filed on Nov. 18, 2004, now Pat. No. 7,271,870, which is a continuation of application No. 10/660,696, filed on Sep. 12, 2003, now Pat. No. 6,839,106, which is a continuation of application No. 10/158,902, filed on (Continued)

(30) Foreign Application Priority Data

Jul. 25, 1995 (JP) .................................... 7-188783

(51) Int. Cl.
*G02F 1/136* (2006.01)
*G02F 1/1345* (2006.01)

(52) U.S. Cl.
USPC .............. 349/43; 349/149; 349/150; 349/152

(58) Field of Classification Search .................... 349/43, 349/149–152
See application file for complete search history.

(56) References Cited

U.S. PATENT DOCUMENTS

| 4,545,647 A | 10/1985 | Sasaki et al. |
| 5,187,604 A | 2/1993 | Taniguchi et al. |

(Continued)

FOREIGN PATENT DOCUMENTS

| JP | Sho 58-63150 | 4/1983 |
| JP | Sho 62-210494 | 9/1987 |

(Continued)

*Primary Examiner* — Huyen Ngo
(74) *Attorney, Agent, or Firm* — Antonelli, Terry, Stout & Kraus, LLP.

(57) ABSTRACT

A display device including a thin film transistor having a semiconductor layer comprising an i-type semiconductor and an impurity doped semiconductor laminated over a first insulating film, a first electrode formed over the semiconductor layer, and a second electrode formed by a part of a data line. A second insulating film is formed over the data line and the transistor and a third electrode is formed over the second insulating film and overlapped with a gate line. In a cross section of an end portion of the first electrode in a direction of a length of a channel, the impurity doped semiconductor extends a minimum distance of 0.2 µm beyond the first electrode in the direction of a length of a channel of the transistor and the i-type semiconductor extends beyond the impurity doped semiconductor in the direction of a length of a channel.

18 Claims, 15 Drawing Sheets

Related U.S. Application Data

Jun. 3, 2002, now Pat. No. 6,667,778, which is a continuation of application No. 10/118,081, filed on Apr. 9, 2002, now Pat. No. 6,590,623, which is a continuation of application No. 09/717,265, filed on Nov. 22, 2000, now Pat. No. 6,424,389, which is a continuation of application No. 09/342,174, filed on Jun. 29, 1999, now abandoned, which is a continuation of application No. 09/207,742, filed on Dec. 8, 1998, now Pat. No. 6,377,323, which is a continuation of application No. 08/683,408, filed on Jul. 19, 1996, now Pat. No. 5,847,781.

(56) References Cited

U.S. PATENT DOCUMENTS

| | | | |
|---|---|---|---|
| 5,198,694 A | * | 3/1993 | Kwasnick et al. ............ 257/766 |
| 5,247,375 A | | 9/1993 | Mochizuki et al. |
| 5,648,674 A | | 7/1997 | Weisfield et al. |
| 6,078,366 A | * | 6/2000 | Dohjo et al. .................. 349/43 |
| 6,128,050 A | * | 10/2000 | Sekiguchi ...................... 349/40 |
| 6,825,893 B2 | | 11/2004 | Choi |
| 6,982,568 B2 | | 1/2006 | Nojiri et al. |
| 7,388,641 B2 | | 6/2008 | Kim |
| 7,630,047 B2 | | 12/2009 | Kim |
| 2002/0075424 A1 | | 6/2002 | Sakamoto et al. |

FOREIGN PATENT DOCUMENTS

| | | |
|---|---|---|
| JP | 63-056626 | 3/1988 |
| JP | 04-001725 | 1/1992 |
| JP | 04-080721 | 3/1992 |
| JP | 04-084125 | 3/1992 |
| JP | 04-100022 | 4/1992 |
| JP | 04-267344 | 9/1992 |
| JP | 05-053148 | 3/1993 |
| JP | 05-119350 | 5/1993 |
| JP | 06-132531 | 5/1994 |
| JP | 06-160901 | 6/1994 |
| JP | 06-26822 | 9/1994 |
| JP | 06-250210 | 9/1994 |
| JP | 06-291318 | 10/1994 |

* cited by examiner

LIQUID CRYSTAL DISPLAY DEVICE HAVING A THIRD ELECTRODE FORMED OVER A SECOND INSULATING FILM AND OVERLAPPED WITH A PAIR OF GATE LINES

CROSS-REFERENCE TO RELATED APPLICATION

This Application is a continuation of U.S. application Ser. No. 13/037,925, filed Mar. 1, 2011, which, now U.S. Pat. No. 8,107,028 in turn, is a continuation of application Ser. No. 12/562,636, filed Sep. 18, 2009 (now U.S. Pat. No. 7,907, 225), which, in turn is a continuation of application Ser. No. 11/929,025, filed Oct. 30, 2007 (now U.S. Pat. No. 7,605, 900); which, in turn, is a Continuation of application Ser. No. 11/338,853, filed Jan. 25, 2006 (now U.S. Pat. No. 7,375, 786); which, in turn, is a Continuation of U.S. application Ser. No. 10/990,497, filed Nov. 18, 2004 (now U.S. Pat. No. 7,271,870); which, in turn, is a Continuation of U.S. application Ser. No. 10/660,696, filed Sep. 12, 2003 (now U.S. Pat. No. 6,839,106); which, in turn, is a Continuation of U.S. application Ser. No. 10/158,902, filed Jun. 3, 2002 (now U.S. Pat. No. 6,667,778); which, in turn, is a Continuation of U.S. application Ser. No. 10/118,081, filed Apr. 9, 2002 (now U.S. Pat. No. 6,590,623); which, in turn, is a Continuation of U.S. application Ser. No. 09/717,265, filed Nov. 22, 2000 (now U.S. Pat. No. 6,424,389); which, in turn, is a Continuation of U.S. application Ser. No. 09/342,174, filed on Jun. 29, 1999 (now abandoned); which, in turn, is a Continuation of U.S. application Ser. No. 09/207,742, filed Dec. 8, 1998, (now U.S. Pat. No. 6,377,323); and which, in turn, is a Continuation of U.S. application Ser. No. 08/683,408, filed Jul. 19, 1996, (now U.S. Pat. No. 5,847,781); and the entire disclosures of all of which are incorporated herein by reference. The above-said U.S. application Ser. No. 11/929,025 is the first of three concurrently filed Continuation Applications in the same family of continuing applications filed on Oct. 30, 2007, the other two being application Ser. No. 11/929,085 (now U.S. Pat. No. 7,450,192) and application Ser. No. 11/929,159 (now U.S. Pat. No. 7,535,536). Applicants wish to make known, also, U.S. application Ser. No. 09/342,173, filed Jun. 29, 1999 (now U.S. Pat. No. 6,275,278) which is a Continuation of said application Ser. No. 09/207,742, filed Dec. 8, 1998 (now U.S. Pat. No. 6,377,323).

BACKGROUND OF THE INVENTION

The present invention relates to an active matrix addressing type liquid crystal display device using thin film transistors (TFTs) and a method of manufacturing the same.

An active matrix addressing type liquid crystal display device includes switching elements each being provided correspondingly to one of a plurality of pixel electrodes arranged in a matrix. The active matrix addressing type display has a feature that liquid crystal at each pixel is theoretically driven at all times and accordingly it is higher in contrast than a simple matrix type adopting time-multiplexed driving. Such an active matrix addressing type display has become essential, particularly for color display.

A TFT arrangement used for a conventional active matrix addressing type liquid crystal display device includes a scanning signal line (gate line) formed on a transparent insulating substrate; a gate insulator formed on the scanning signal line; a semiconductor layer formed on the gate insulator; and a drain electrode (data line) and a source electrode formed on the semiconductor film, wherein the source electrode is connected to a transparent pixel electrode and the drain electrode (data line) is supplied With a video signal voltage. A TFT structure of a type in which a gate electrode is formed directly on a substrate is generally called an inverted staggered structure. Such a TFT is known from Japanese Patent Laid-open No. Sho 61-161764.

The liquid crystal display device using TFTs enables active addressing and thereby it exhibits high contrast; however, it is complicated in formation of TFTs on a substrate and also requires six or more photolithography steps. This is disadvantageous in terms of increasing manufacturing cost of a TFT substrate and decreasing processing yield with the increased number of manufacturing steps due to dust or dirt.

A method for simplifying manufacturing steps has been proposed, wherein a gate insulator, a semiconductor layer, and a metal film (for drain and source electrodes) are formed; the semiconductor layer is processed using the metal film as a mask; and a transparent electrode is formed. This prior art, however, is disadvantageous in that in the case where the metal film forming the source electrode is smaller in etching rate than the semiconductor film, the source electrode overhangs and increases open line defect probabilities for the transparent electrode due to the presence of a step at the overhang. In other words, in the above prior art the manufacturing yield has never been considered sufficiently.

It is required to increase the size of an area of a transmitting portion (hereinafter, referred to as an aperture ratio) of a transparent pixel electrode for realizing a bright display screen. The above-described prior art, however, failed to improve the aperture ratio for obtaining a display of high contrast and low cross talk.

SUMMARY OF THE INVENTION

An object of the present invention is to provide an active matrix addressing type liquid crystal display device capable of obtaining a display screen of high contrast and low cross talk.

Another object of the present invention is to provide a method of making an active matrix addressing type liquid crystal display device, which is capable of reducing the number of manufacturing steps and increasing a manufacturing yield.

To achieve the above objects, according to one preferred embodiment of the present invention, there is provided a liquid crystal display device including a plurality of scanning signal lines extending in a direction on a substrate; a first insulating film covering the plurality of scanning signal lines; a plurality of data lines extending on the first insulating film in such a manner as to intersect the plurality of scanning signal lines; a plurality of transparent pixel electrodes disposed at intersections of the plurality of scanning signal lines and the plurality of data lines; a plurality of thin film transistors each associated with one of the plurality of pixel electrodes, an output electrode thereof being connected to one of the plurality of pixel electrodes, a control electrode thereof being connected to one of the plurality of scanning signal lines, and an input electrode thereof being connected to one of the plurality of data lines; and a second insulating film disposed between the plurality of pixel electrodes and the plurality of thin film transistors; wherein a semiconductor layer is interposed between the first insulating film and a portion of the plurality of data-lines, and wherein edges of the semiconductor layer are set back inwardly from edges of the plurality of data lines.

According to another preferred embodiment of the present invention, there is provided a method of making a liquid crystal display device, the liquid crystal display device including a plurality of scanning signal lines extending in a direction on a substrate; a first insulating film covering the plurality of scanning signal lines; a plurality of data lines extending on the first insulating film in such a manner as to intersect the plurality of scanning signal lines; a plurality of transparent pixel electrodes disposed at intersections of the plurality of scanning signal lines and the plurality of data lines; a plurality of thin film transistors each associated with one of the plurality of pixel electrodes, an output electrode thereof being connected to one of the plurality of pixel electrodes, a control electrode thereof being connected to one of the plurality of scanning signal lines, and an input electrode thereof being connected to one of the plurality of data lines; and a second insulating film disposed between the plurality of pixel electrodes and the plurality of thin film transistors; wherein a semiconductor layer is interposed between the first insulating film and a portion of the plurality of data lines; the method comprising the steps of: etching a transistor semiconductor layer underlying the output electrode in the plurality of thin film transistors using a photoresist mask formed on the transistor semiconductor layer such that an etched end of the transistor semiconductor layer on a side of the output electrode extends beyond an end of the output electrode; and etching an end of the semiconductor layer underlying the plurality of data lines using a metal film making up the plurality of data lines as a mask.

BRIEF DESCRIPTION OF THE DRAWINGS

In the drawings, which form an integral part of the specification and are to be read in conjunction therewith, and in which like reference numerals designate similar components throughout the figures, and in which.

DETAILED DESCRIPTION OF THE PREFERRED EMBODIMENTS

Hereinafter, a liquid crystal display device and a method of making the same according to the present invention will be described by way of preferred embodiments.

Figure 2:
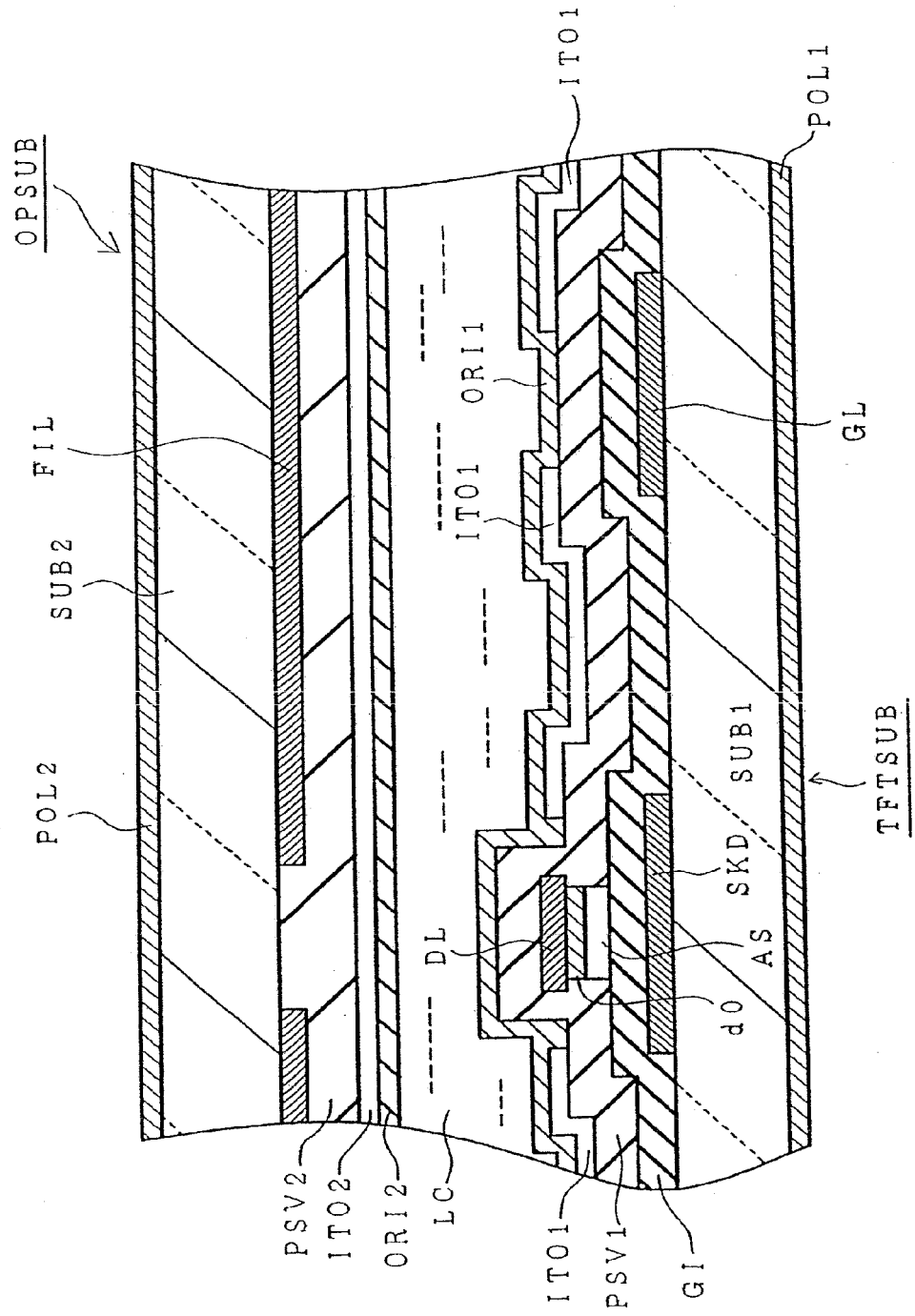
FIG. 2 is a sectional view taken on line II-II of FIG. 1.

FIG. 2 shows a sectional structure of a matrix portion (display portion) in an active matrix addressing type liquid crystal display device according to a preferred embodiment of the present invention. A display panel includes a TFT substrate TFTSUB composed of a transparent glass substrate SUB1 having one surface on which thin film transistors, pixel electrodes ITO1 and various interconnections are formed; a counter substrate OPSUB composed of a transparent glass substrate SUB2 having one surface on which a common electrode ITO2 and color filters FIL are formed; and a liquid crystal layer LC filled in a gap between the opposed substrates TFTSUB and OPSUB.

When a video signal voltage is applied between the pixel electrodes ITO1 and the common electrode ITO2 to control an electro-optical state of the liquid crystal layer LC between both the electrodes, a light transmissive state of such a pixel portion of the display panel is changed to display a desired image.

A back light source is provided outside the counter substrate OPSUB or the TFT substrate TFTSUB of the liquid crystal panel for permitting a light passing through a pixel portion of the liquid crystal panel to be observed from the side opposite the back light source.

It is to be noted that parts having the same functions are designated by the same characters in the figures described in the following.

(TFT Substrate)

Figure 1:
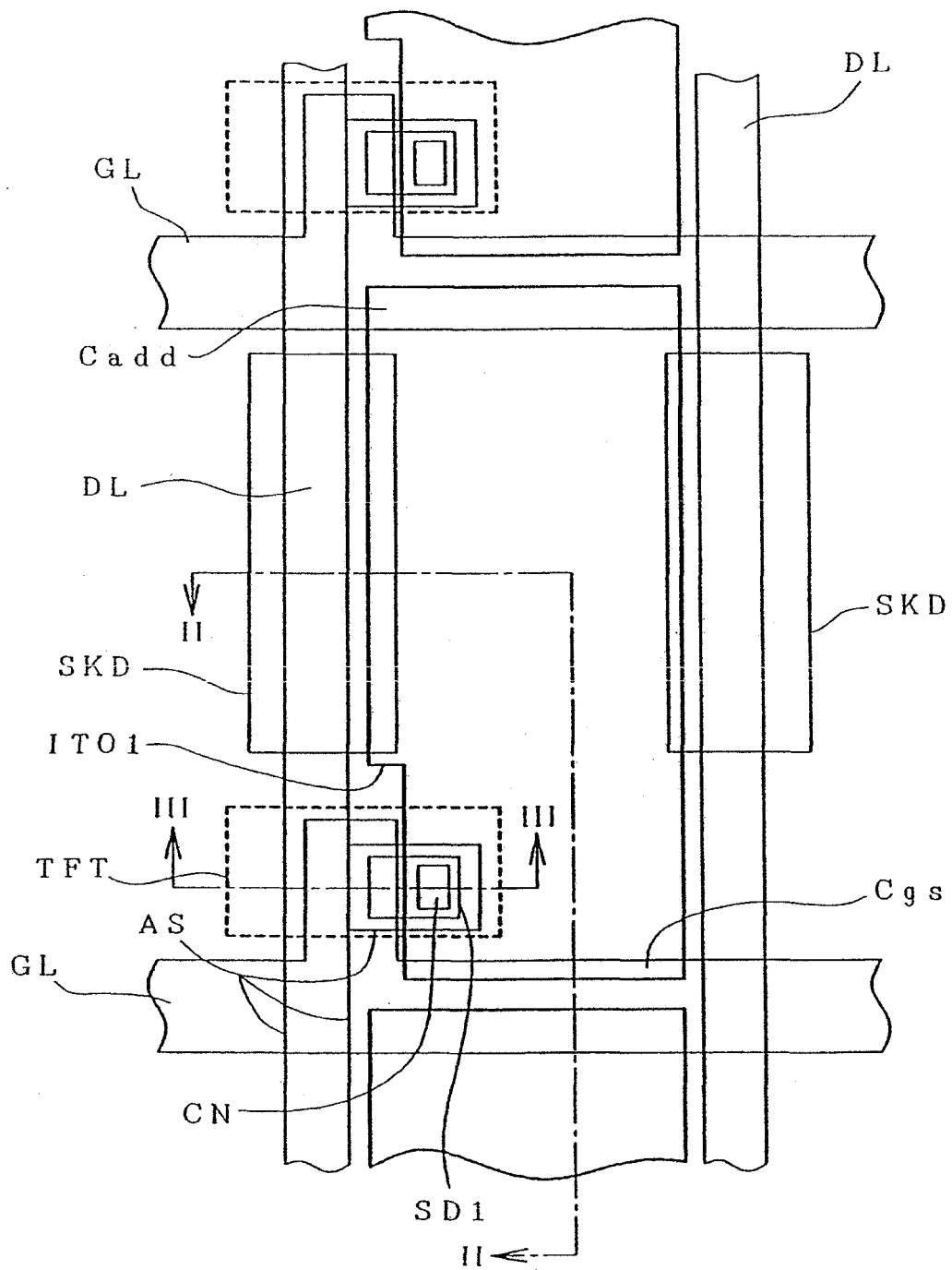
FIG. 1 is a plan view showing a pattern of each layer of one pixel and its neighborhood on a TFT substrate according to a first embodiment of the present invention.

FIG. 1 is a plan view of a pattern of each layer constituting the TFT substrate TFTSUB, showing one pixel and its neighborhood; FIG. 2 is a sectional view of the display panel, taken on line II-II of FIG. 1; and FIG. 3 is a sectional view taken on line III-III of FIG. 1.

Next, the structure of the TFT substrate TFTSUB will be fully described with reference to FIGS. 1 to 3. A plurality of parallel gate lines (scanning signal lines or horizontal signal lines) GL and a plurality of parallel data lines (video signal lines or vertical signal lines) DL intersecting a plurality of gate lines are provided on the surface of the TFT substrate. A pixel electrode region is defined by the two adjacent gate lines GL and the two adjacent data lines DL, and a pixel electrode ITO1 is formed over substantially the entire surface of this region. A thin film transistor (a region shown by a broken line in FIG. 1) serving as a switching element is formed in a protruding portion (upward protruding portion in FIG. 1) of the gate line correspondingly to each pixel electrode, and it has a source electrode SD1 connected to the pixel electrode. A scanning voltage applied to the gate line GL is supplied to a gate electrode of the TFT, constituting a portion of the gate line, to turn on the TFT. At this time, a video signal supplied to the data line DL is written into the pixel electrode ITO1 through the source electrode SD1.

(Thin Film Transistor TFT)

Figure 3:
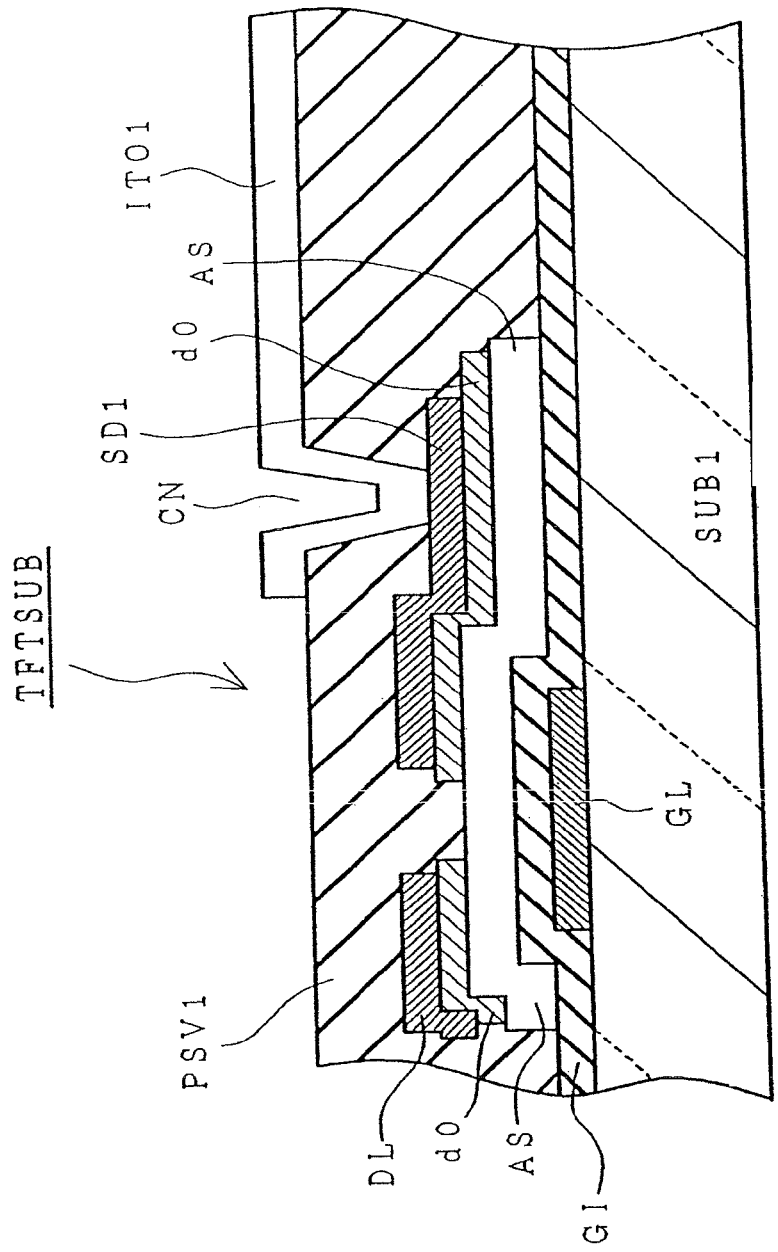
FIG. 3 is a sectional view taken on line III-III of FIG. 1 showing a thin film transistor and a portion in the vicinity of a pixel electrode on a thin film transistor substrate in the embodiment.

Referring to FIG. 3, the gate line GL is formed of a conductive film on the transparent glass substrate SUB1, and an insulating film and semiconductor layers are formed thereon to form a thin film transistor TFT (described in detail later).

When a gate voltage is applied to the gate line GL, a channel resistance between a source and a drain (data line DL) in the TFT becomes small. On the other hand, when the gate voltage is reduced to zero, the channel resistance becomes large. A gate insulator GI made of silicon nitride is provided on the gate electrode constituting a portion of the gate line GL, and an i-type (intrinsic type) semiconductor layer AS made of amorphous silicon doped, with no intentional impurity and an n-type semiconductor layer d0 made of amorphous silicon doped with an impurity are formed on the gate insulator GI. The i-type semiconductor layer AS functions as an active layer of the thin film transistor. The source electrode SD1 and a drain electrode are formed thereon, thus forming a thin film transistor. It is to be noted that a portion of the data line-constitutes the drain electrode in this embodiment and the drain electrode is hereinafter referred to as the data line DL unless otherwise specified.

The gate insulator GI is formed of silicon nitride to a thickness of from 2000 to 5000 Å (about 3500 Å in this embodiment) by, for example, plasma CVD.

The i-type semiconductor layer AS is formed in thickness of from 500 to 2500 Å (2000 Å in this embodiment). The thin n-type semiconductor layer d0 is formed of amorphous silicon doped with phosphor (P) in thin thickness of 500 Å or less so as to form an ohmic contact with the i-type semiconductor layer AS.

Additionally, the naming of each of source and drain electrodes is essentially determined in accordance with a polarity of a voltage applied between the source and drain electrodes. The source and drain electrodes in the liquid crystal display device of the present invention alternate with each other because the polarities are reversed during operation; however, in the following description, one is fixedly called a source electrode and the other is fixedly called the drain electrode for convenience.

(Source Electrode)

As shown in FIG. 3, the source electrode SD1 is formed of chromium (Cr) on the n-type semiconductor layer d0 in thickness of from 600 to 2000 Å (about 1800 Å in this embodiment). The source electrode SD1, however, may be formed of one kind selected from a group consisting of various refractory metals (Ti, Ta, W, Mo) other than Cr and alloys thereof.

As shown in FIGS. 1, 3, the source electrode SD1 is formed on the i-type semiconductor layer AS and the n-type semiconductor layer d0 formed within one pixel region in such a manner that the end portion of the i-type semiconductor layer As extends beyond the end portion of the source electrode SD1 at least in the channel length direction. The pixel electrode ITO1 is formed of a conductive film on a protective insulating film PSV1 and is connected to the source electrode SD1 through an opening portion (hereinafter, referred to as a contact hole) CN formed in the protective insulating film PSV1.

With this structure, the transparent conductive film ITO1 can be formed in such a manner as to easily traverse a step formed by the underlying source electrode SD1 without open line defects at the step (described in detail later). Such an effect is conspicuous in the case where the pixel electrode ITO1 is made of ITO (indium-tin-oxide) as in this embodiment. The etching rate of ITO is larger in grain boundaries than in crystal grains because ITO has a large crystal grain size. Accordingly, the pixel electrode ITO1 tends to be easily broken at a step of the underlying layer unless the cross-section of the underlying layer is smoothed.

In this regard, the etching of a semiconductor film using as a mask a metal film on the semiconductor film as described in the Japanese Patent Laid-open No. Sho 61-161764 is disadvantageous in that the metal film overhangs in cross-section because it is smaller in etching rate than the semiconductor film, with a result that a transparent conductive film tends to be easily broken at such an overhang. In this embodiment, since such a step is smoothed as described above, open line defect probabilities for the pixel electrode ITO1 is greatly reduced.

(Pixel Electrode)

The pixel electrode is formed of the transparent conductive film ITO1 made of ITO. This is connected to the source electrode SD1 of the thin film transistor. The transparent conductive film ITO1 is formed of sputtered ITO in thickness of from 300 to 3000 Å (about 1400 Å in this embodiment).

(Gate Line)

As shown in FIGS. 2, 3, the gate line GL is formed of a single layer conductive film. The conductive film is formed of chromium (Cr) by sputtering in thickness of from 600 to 2000 Å (about 1800 Å in this embodiment). The gate line GL may be made from one kind selected from a group consisting of other refractory metals and alloys thereof, like the source electrode SD1.

(Data Line DL)

As shown in FIGS. 2, 3, the data line DL, which is the same conductive film as that of the source electrode SDI, is formed on the gate insulator GI and the semiconductor layers As, dO sequentially formed on the transparent glass substrate SUB1. The data line DL and the semiconductor layers As, dO form a stacked structure in cross-section. The reason why each layer in the stacked structure has approximately the same pattern is due to processing of the i-type semiconductor layer AS using the data line DL as a mask (described later in the paragraph of the manufacturing method). In the stacked structure, the layer mainly contributing to electric conduction and signal transmission is the conductive layer DL.

(Storage Capacity Cadd, Parasitic Capacity Cgs)

A storage capacity Cadd is a capacity formed in a region where a pixel electrode ITO1 of a TFT is overlapped on the gate line GL preceding by one scanning line the gate line GL connected to the TFT with a laminated film of the gate insulator GI and the protective insulating film PSVI interposed therebetween. The storage capacity Cadd functions to reduce the discharge of charges in the capacity of the liquid crystal LC and a decay in its voltage when the TFT is in the OFF state.

A parasitic capacity Cgs is a capacity in a region where a pixel electrode of a TFT is overlapped on the gate line GL connected to the TFT with a laminated film of the gate insulator GI and the protective insulating film PSVI interposed therebetween. As shown in FIG. 2, the transparent conductive films ITO1 adjacent to each other over the gate line GL are spaced from each other.

Unlike the prior art structure in which the transparent conductive film ITO1 is not overlapped on the gate line GL connected to the TFT, the inventive structure provided with the parasitic capacity Cgs eliminates the necessity of covering a gap between the gate line GL and the pixel electrode ITO1 with a black matrix BM otherwise formed on the counter substrate OPSUB, and thereby increasing the aperture ratio of the pixel electrode.

(Light-Blocking Film SKD)

As shown in FIGS. 1, 2, a light-blocking film SKD, which is the same conductive film as that of the gate line GL, is formed on the transparent glass substrate SUB1 of the TFT substrate TFTSUB.

The light-blocking film SKD is overlapped on the pixel electrode ITO1 along the data line DL and further extends under the data line DL, as shown by its layer pattern in FIG. 1. On the other hand, the light-blocking film SKD is insulated from the data line DL by the gate insulator GI and the semiconductor layers AS, d0 as shown by the sectional view in FIG. 2, to thereby prevent short-circuit between the light-blocking film SKD and the data line DL. The light-blocking film SKD is also insulated from the pixel electrode ITO1 by the gate insulator GI and the protective insulating film PSV1.

The semiconductor layers AS, d0 interposed, in addition to the gate insulator GI between the light-blocking film SKD and the data line DL are shielded from light illumination and function as insulators, increase a distance between the light-blocking film SKD and the data line DL, and an electrostatic coupling between the light-blocking film SKD and the data line DL is reduced, so that an electrostatic coupling between the data line DL and the pixel electrode ITO1 by way of the light-blocking film SKD is decreased, resulting in reduced cross talk.

Like the above-described parasitic capacity, the light-blocking film SKD has a function to increase an area of a light-transmitting portion, that is, the aperture ratio of a pixel electrode and increase brightness of display as described in detail later. In the display panel shown in FIG. 1, assuming that the back light source (not shown) is set outside the TFT substrate TFTSUB and an image is observed from the counter substrate OPSUB side, an illuminating light passes through the glass substrate SUB1 and enters the liquid crystal layer LC through a portion on which an interconnection line of sputtered Cr is not formed on one surface of the glass substrate SUB1. The transmission of the light is controlled by a voltage applied between a transparent common electrode ITO2 formed on the counter substrate OPSUB and the pixel electrode ITO1 formed on the TFT substrate TFTSUB.

In the case where the display panel is configured to operate in the normally white mode and is not provided with the light-blocking film SKD and the parasitic capacity Cgs, unlike this embodiment, a wide black matrix is necessary on the counter substrate OPSUB. If the black matrix is not formed in the above case, the area between the pixel electrode ITO1 and the data line DL or the gate line GL transmits the leakage light not controllable by the voltage applied, thus reducing the contrast ratio of the display. Moreover, the counter substrate OPSUB and the TFT substrate TFTSUB are secured together with the liquid crystal therebetween, the large tolerance is necessary in registration of the two substrates and this reduces the aperture ratio as compared with this embodiment in which light-blocking is performed only on the TFT substrate TFTSUB.

In the structure of this embodiment, since the light-blocking film SKD and the gate line GL act to reflect light from a back light source, return it to a light guide disposed in back of the back light source, and the light guide reflects and directs the light again toward the aperture of the pixel, the display becomes brighter than the brightness determined by the aperture ratio. In particular, for the structure in which the semiconductor layers AS and d0 are formed under the data line DL, since the semiconductor layers exhibit a light absorbing function, without the light blocking film SKD in back of the semiconductor layers under the data line DL, reflection of light decrease, resulting in dark display.

In this embodiment, the semiconductor layers under the data line DL are processed using the data line DL as a mask, and the conductive film constituting the data line DL does not traverse a step of the semiconductor layer AS, thus reducing open line defect probabilities. Accordingly, the combination of the light-blocking film SKD and the data line DL exhibits a new effect in addition to a bright display.

Additionally, the Cr film formed by sputtering is used as the gate line GL and the light-blocking film SKD in this embodiment; however, a multi-layered light-blocking structure with reduced reflection may be used, for which chromium oxide is initially formed on the substrate and then the Cr film is formed by consecutive sputtering.

(Protective Film)

As shown in FIGS. 1, 3, the surface of the TFT substrate TFTSUB on the side where the thin film transistor TFT is formed is covered with the protective film PSV1 excluding a contact hole CN for connecting the source electrode SD1 to the pixel electrode ITO1 and a gate terminal portion and a drain terminal portion provided on a peripheral portion of the TFT substrate (described later).

(Gate Terminal GTM)

Figure 4:
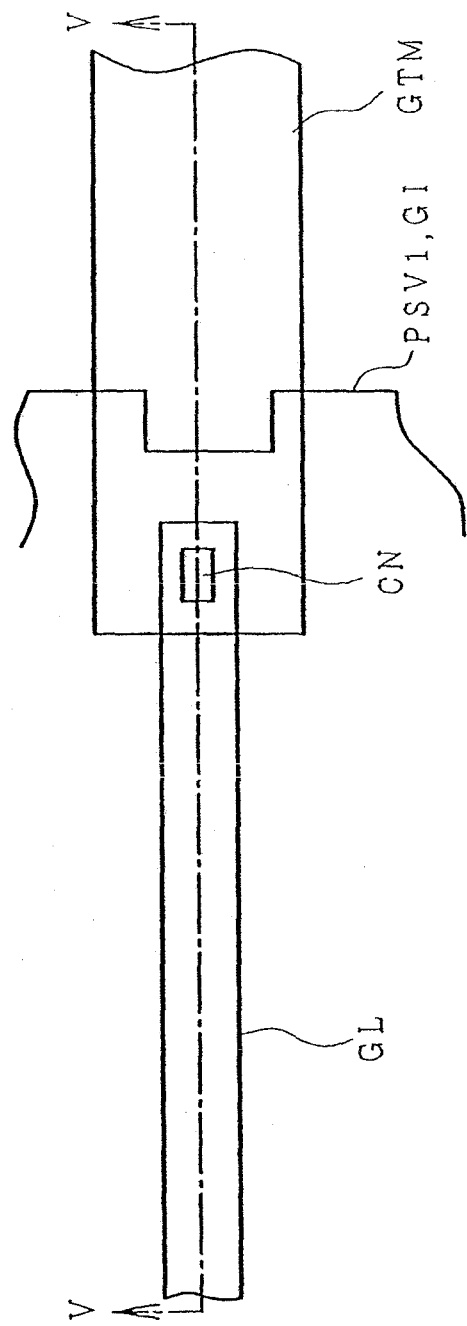
FIG. 4 is a plan view showing a connection portion of a gate terminal GTM and a gate line GL according to one embodiment of the present invention.
Figure 5:
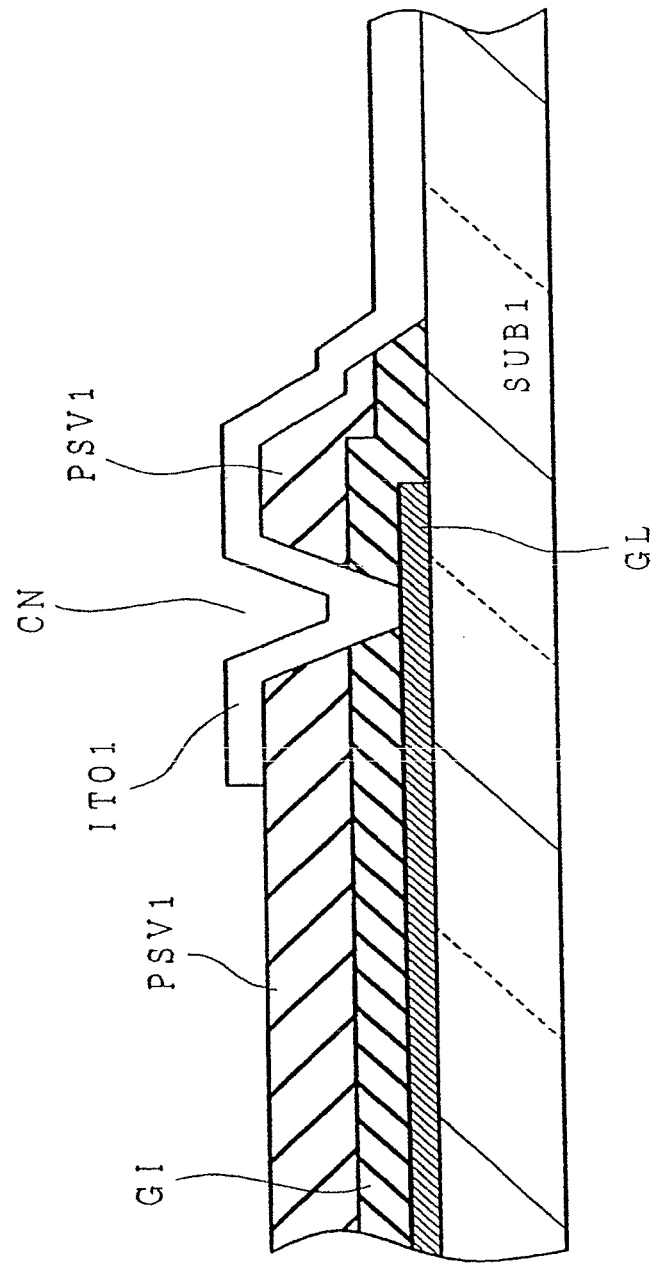
FIG. 5 is a sectional view showing a connection portion of a gate terminal GTM and a gate line GL according to the embodiment shown in FIG. 4.

FIG. 4 is a plan view showing a portion ranging from the vicinity of the end of the gate line GL to a gate terminal GTM to be connected to an external drive circuit on the TFT substrate TFTSUB; and FIG. 5 is a sectional view taken on line V-V of FIG. 4.

The gate terminal GTM formed of the transparent conductive film ITO is exposed to the outside. The conductive film of the gate terminal GTM is formed simultaneously with the transparent conductive film ITO1 of the pixel electrode. The gate terminal GTM has a pattern wider than that of the gate line GL for preventing the gate line GL made of chromium from being corroded by permeation of chemicals, water and the like. In this structure, only the transparent conductive film ITO1 is exposed to the outside, in addition to the protective film Psv1. ITO (indium-tin-oxide), which is an oxide, has a large resistance against corrosion and oxidation, and accordingly, this structure has a high reliability.

The use of the gate terminal GTM made of ITO in the liquid crystal display device using TFTs thus makes it possible to ensure a high manufacturing yield and a high reliability.

(Drain Terminal DTM)

Figure 6:
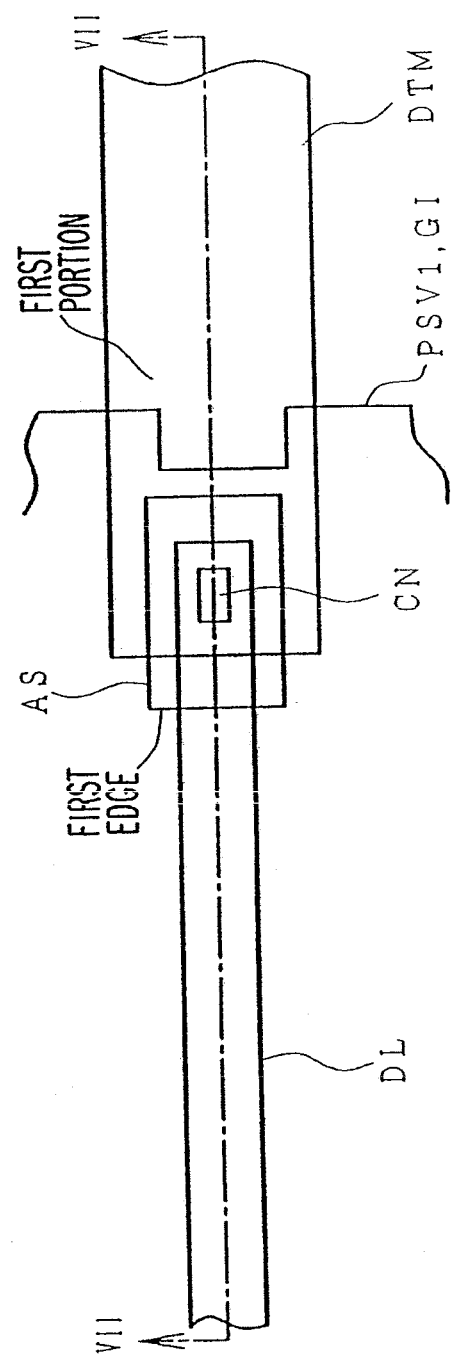
FIG. 6 is a plan view showing a connection portion of a drain terminal DTM and a data lime DL according to one embodiment of the present invention.
Figure 7:
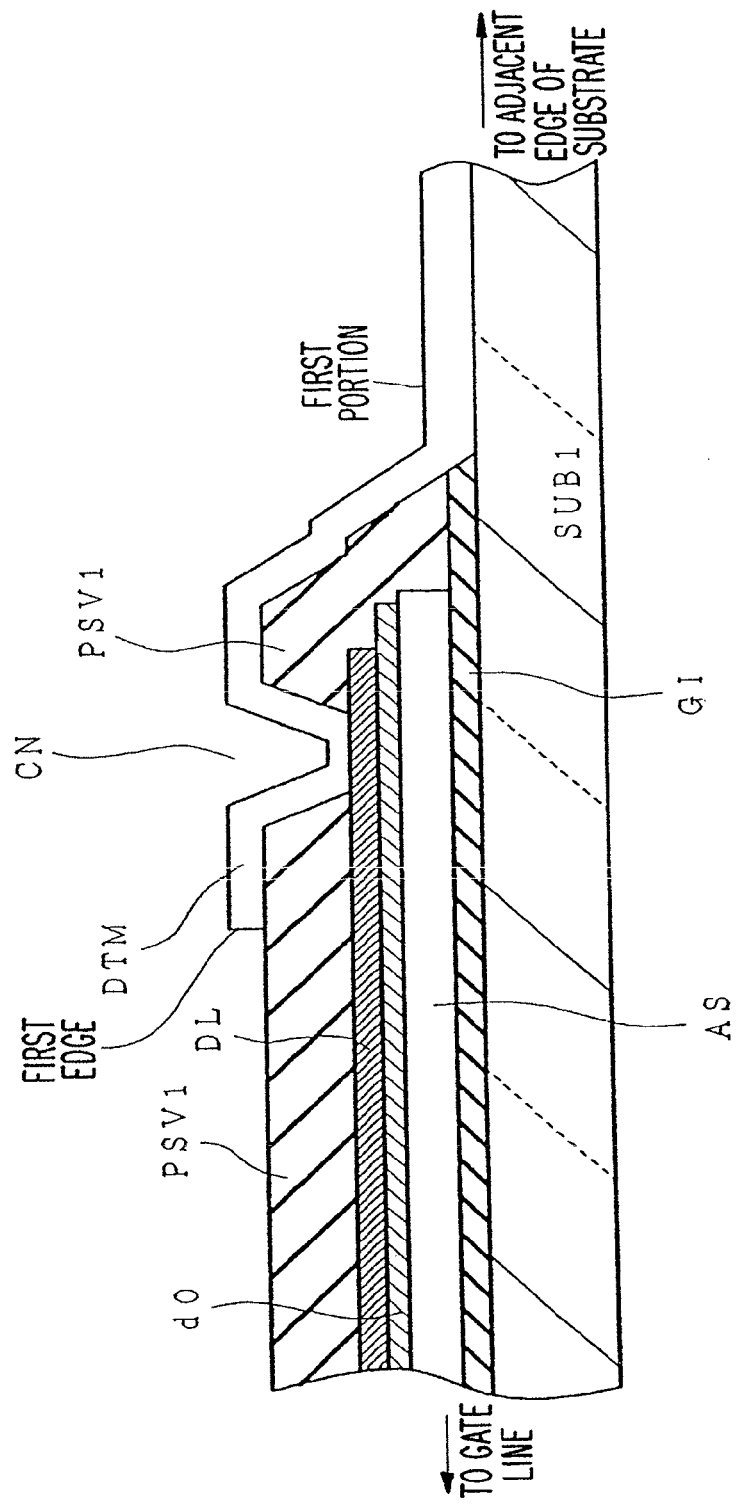
FIG. 7 is a sectional view showing a connection portion of a data terminal DTM and a data line DL according to the embodiment shown in FIG. 6.

FIG. 6 is a plan view showing a portion ranging from the vicinity of the end of the data line DL to a drain terminal DTM to be connected to an external drive circuit on the TFT substrate; and FIG. 7 is a sectional view taken on line VII-VII of FIG. 6.

The drain terminal DTM is formed of the transparent conductive film ITO, like the gate terminal GTM. The drain terminal DTM has a pattern wider than that of the data line DL. In addition, the protective film PSV1 is removed from the drain terminal DTM for connection with an external drive circuit.

As shown by the sectional structure, of FIG. 7, like the source electrode SD1 shown in FIG. 3, the i-type semiconducting later AS extends longer than the data line DL at the end portion of the data line DL. This is effective to reduce the open line defect probabilities of the drain terminal DTM at the end portion of the data line DL.

Figure 8:
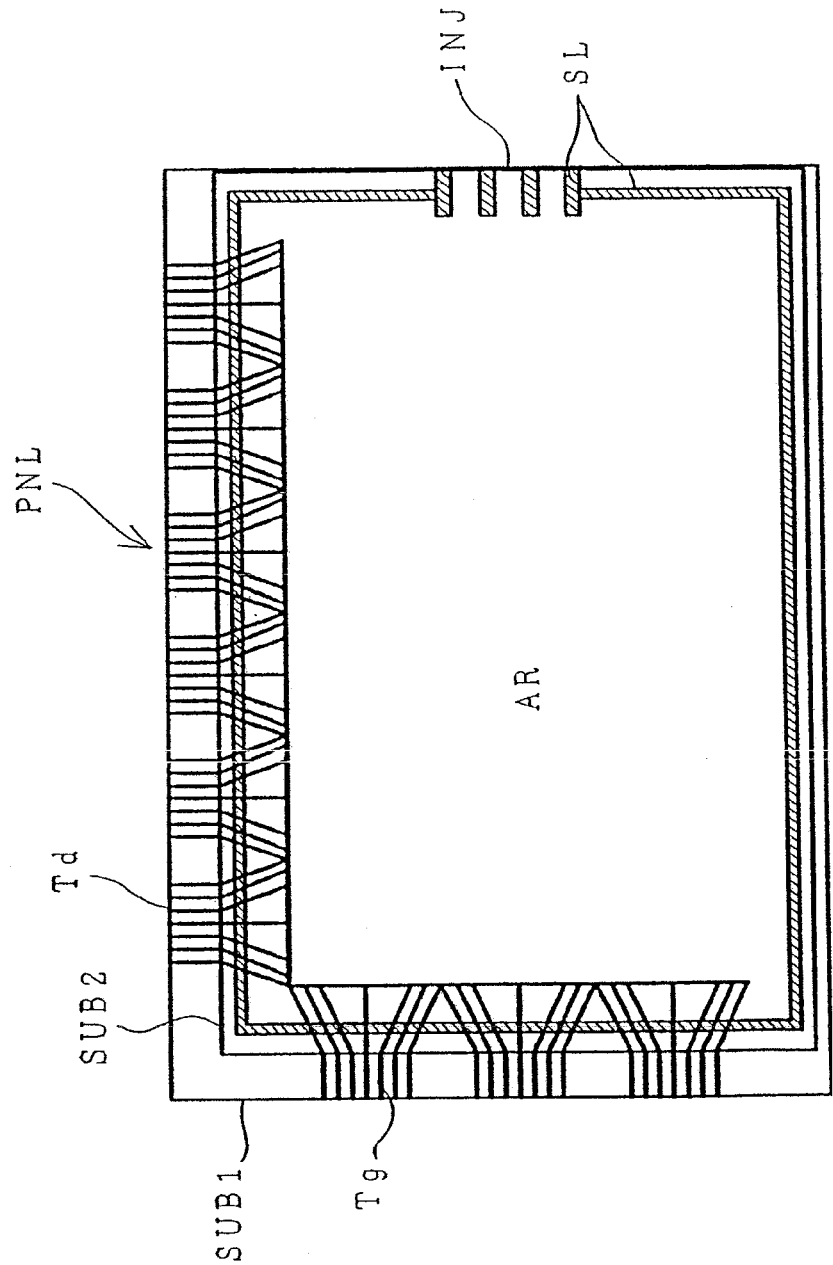
FIG. 8 is a plan view illustrating the configuration of a peripheral portion of a matrix of a display panel according to one embodiment of the present invention.

FIG. 8 is a plan view showing a schematic structure of a peripheral portion of the display panel PNL. In the peripheral portion of the TFT substrate TFTSUB (SUB1), a plurality of the gate terminals GTM are arranged correspondingly to a plurality of the gate lines GL, to form a gate terminal group Tg while a plurality of the drain terminals DTM are arranged correspondingly to a plurality of the data lines DL, to form a drain terminal group Td. In addition, character INJ in FIG. 8 designates a portion where a seal pattern SL for securing the TFT substrate TFTSUB and the counter substrate OPSUB together is not provided. After both substrates are secured together, liquid crystal is injected through the portion INJ.

(Counter Substrate OPSUB)

As shown in FIG. 2, color filters FIL for red, green and blue, a protective film PSV2, the transparent common electrode ITO2 and an orienting film ORI2 are sequentially formed on one surface of the transparent glass substrate SUB2. A polarizer POL2 is attached on the other surface of the transparent glass substrate SUB2, and a polarizer POL1 is attached on the surface of the TFT substrate TFTSUB on the side where the TFTS are not formed, for polarizing and analyzing a light, respectively.

Although a light-blocking black matrix BM is not formed on the glass substrate SUB2 shown in FIG. 2, in actual practice there is a black matrix formed of a sputtered Cr film, a stacked layer of Cr oxide and Cr, or a resin film disposed at a position corresponding to the TFT portion in FIG. 1.

(Method of Making TFT Substrate TFTSUB)

Figure 9:
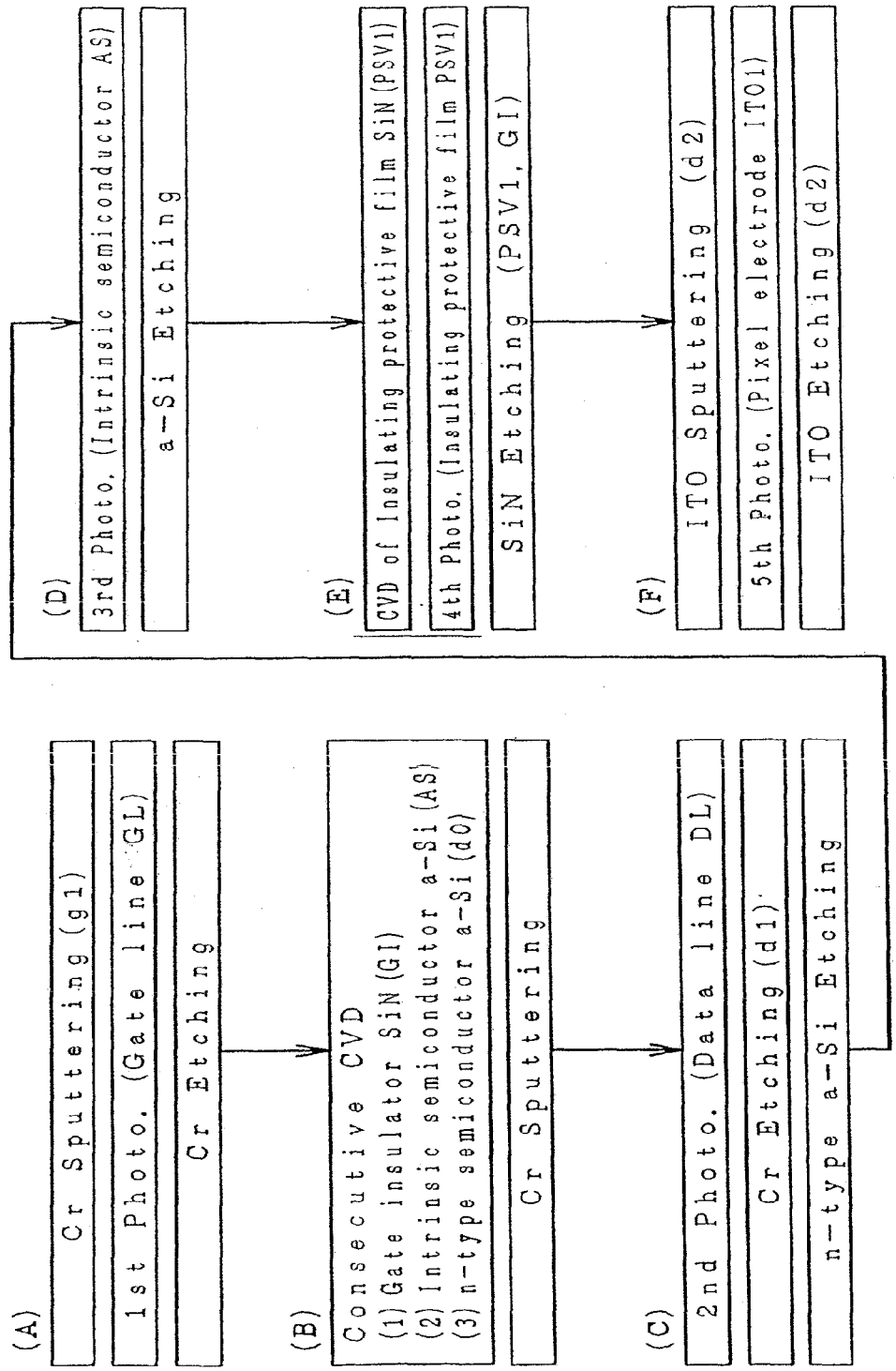
FIG. 9 is a flow chart showing a method of making a TFT substrate TFTSUB of a liquid crystal display device according to the first embodiment.

Hereinafter, a method of making the above-described TFT substrate TFTSUB of the liquid crystal display device will be described with reference to FIGS. 9 to 15. FIG. 9 is a flow chart showing the flow of steps (A) to (F) for making the TFT substrate TFTSUB; and FIGS. 10 to 15 show sectional structures of the liquid crystal display device in the steps (A) to (F), respectively. Each figure excluding FIG. 11 shows the sectional structure directly after a thin film is etched in each step excluding the step (B), and a photoresist used as a mask is left on the thin film in each cross-section for convenience of explanation. Each figure is a sectional view of a portion in the vicinity of a connection portion of the thin film transistor and a pixel electrode on the TFT substrate TFTSUB (see the sectional view of FIG. 3). The sectional structure of the liquid crystal display device processed in the final step shown in FIG. 9 corresponds to that shown in FIG. 3. Each of the steps (A), (C), (D), (E) and (F) includes a photolithograph processing. The photolithographic processing in the present invention includes a series of processes of coating photoresist, selective exposure using a mask and development. As can be seen from FIG. 9, the photolithographic processing is repeated five times until the TFT substrate is finished.

The steps will be sequentially described.

Figure 10:
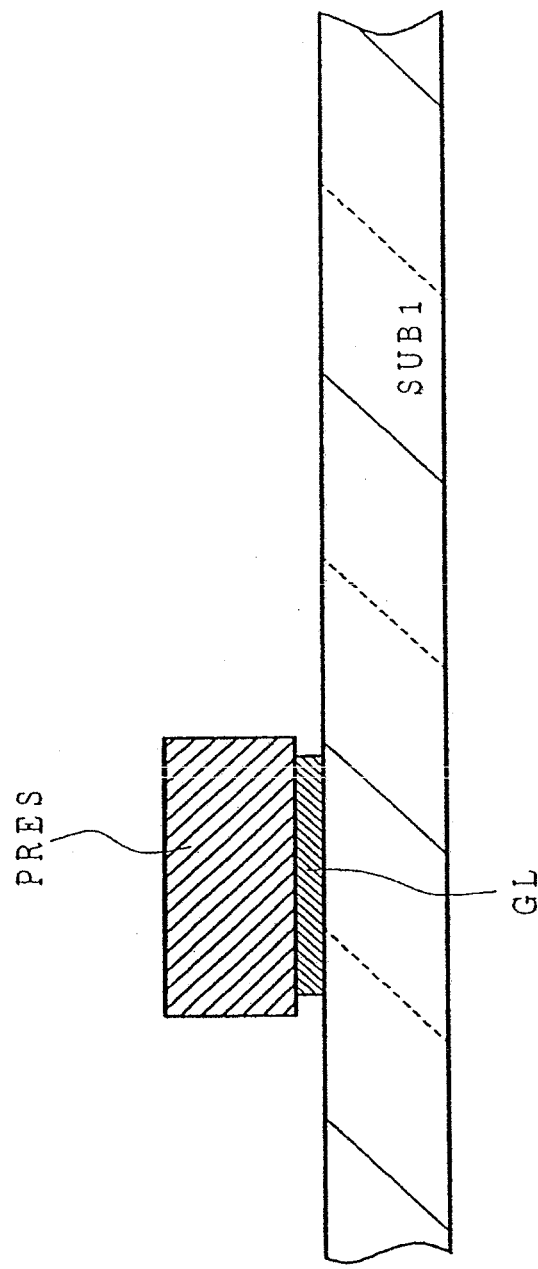
FIG. 10 is a sectional view of a liquid crystal display device corresponding to a step A in FIG. 9.
Figure 11:
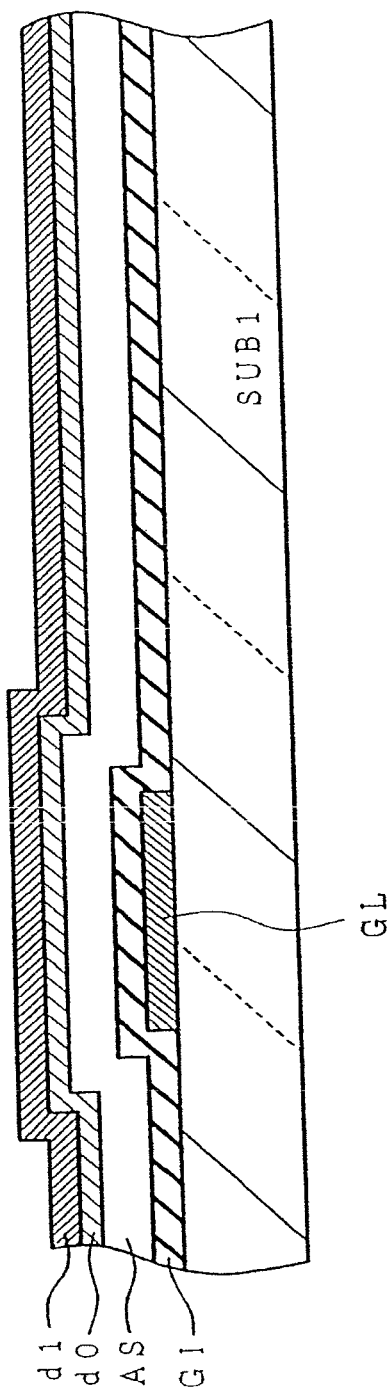
FIG. 11 is a sectional view of a liquid crystal display device corresponding to a step B in FIG. 9.

Step A (FIG. 10)

A transparent glass substrate SUB1 is prepared, and a Cr film is formed on one surface of the transparent glass substrate SUB1 by sputtering. A mask of a photoresist PRES is formed in a specified pattern on the Cr film by a first photolithography processing, and the Cr film is selectively etched using the mask, to obtain a conductive film having the specified pattern. This conductive film forms a gate line GL or a light-blocking film SKID.

Step B (FIG. 11)

A silicon nitride film GI, an i-type amorphous Si film AS and an n-type amorphous Si film d0 are sequentially formed on the Cr film provided on the transparent glass substrate SUB1 by plasma CVD, and then a Cr film as a first conductive film d1 is formed thereon by sputtering. The semiconductor films AS, d0 are consecutively formed without a photoresist step, to reduce surface oxidation of the semiconductor layers due to the resist. This is effective to lower a contact resistance between the n-type semiconductor layer d0 and the conductive film d1 and hence to increase electron mobility in the thin film transistor.

Figure 12:
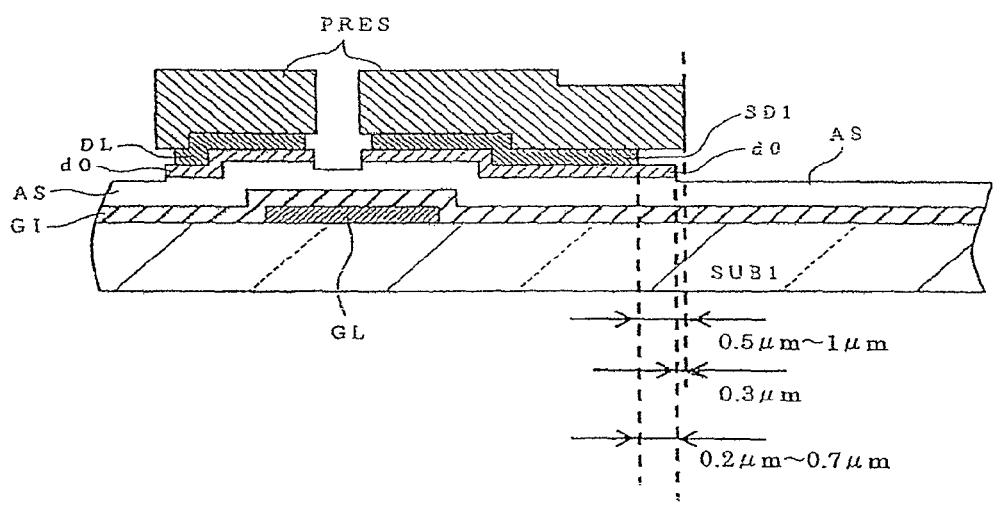
FIG. 12 is a sectional view of a liquid crystal display device corresponding to a step C in FIG. 9.

Step C (FIG. 12)

A mask of the photoresist PRES is formed in a specified pattern on the Cr film (d1) by a second photolithography processing, and the Cr film is selectively etched, to form the specified pattern. Subsequently, the n-type semiconductor layer d0 in the opening is removed by dry etching using the photoresist PRES.

At this time, by wet etching of the Cr film, the end portion of the Cr film, which forms the source electrode SD1, generally retracts by a value from of 0.5 to 1 µm from the end portion of the photoresist PRES. Also, due to anisotropic dry etching of the n-type semiconductor layer d0 and its very small thickness of 500 Å or less as described above, the end portion of the n-type semiconductor layer d0 retracts only by about 0.3 µm from the end portion of the photoresist PRES. As a result, the layer underlying the source electrode SD1 is not etched, and thereby the SD1 does not overhang. As shown in FIG. 12, the distance between the end portion of the source electrode SD1 and the end portion of the semiconductor layer d0 is in a range of 0.2 µm and 0.7 µm.

Figure 13:
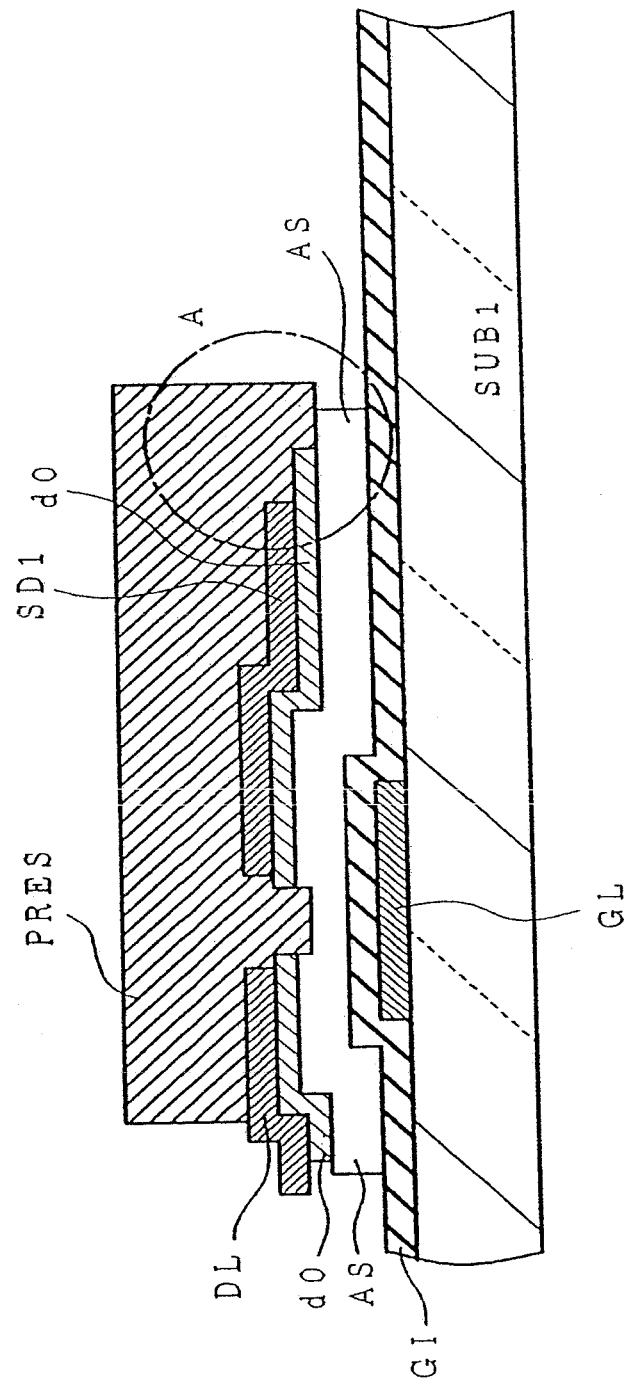
FIG. 13 is a sectional view of a liquid crystal display device corresponding to a step D in FIG. 9.

Step D (FIG. 13)

A mask of another photoresist PRES is then formed in a specified pattern by a third photolithography processing, and the i-type semiconductor layer AS is selectively removed by etching on the gate. insulator GI.

The above photoresist PRES is patterned in such a manner as to be wider than that of the source electrode SD1 at its end portion for the etched i-type semiconductor layer AS to provide a stair case shape at a circled portion A in FIG. 13. This is effective to prevent open line defects of the transparent conductive film subsequently formed above the source electrode at its end portion. On the other hand, the photoresist PRES is not formed on most of the data line shown in FIG. 2, and the semiconductor layers underlying the data line are etched using as a mask the conductive film d1 of the data line DL. Thus, since the i-type semiconductor layer AS does not protrude from under the data line near the data line having no photoresist PRES thereon. This enables high-precision processing, and is effective to improve the aperture ratio, and to reduce a gate capacity to shorten a delay time caused by the gate line.

The experiments by the present inventor showed that in the case where the pattern of the photoresist PRES for etching the i-type semiconductor layer AS is not set to be wider than that of the source electrode SD1 and the i-type semiconductor layer AS is etched using as a mask the conductive film d1 of the source electrode, the underlying semiconductor layer retracts from the end portion of the source electrode SD1 and produces overhangs because the thickness of the i-type semiconducting layer AS is larger than the n-type semiconductor layer d0, with a result that the pixel electrode ITO subsequently formed above the source electrode increases its open line defect probabilities greatly at a step caused by the overhang.

Figure 14:
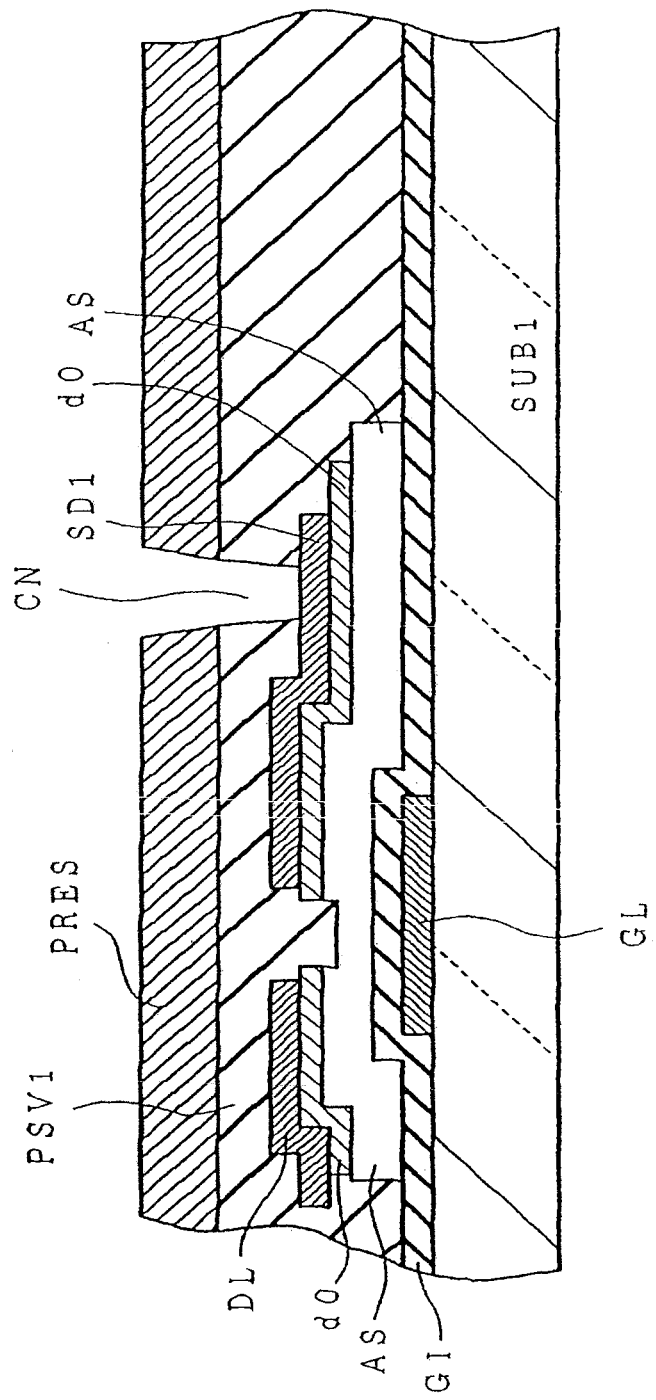
FIG. 14 is a sectional view of a liquid crystal display device corresponding to a step E in FIG. 9.

Step E (FIG. 14)

The protective insulating film PSV1 made of silicon nitride is formed by plasma CVD. A mask of another photoresist PRES is formed by a fourth photolithography processing, and the protective insulating film PSV1 is removed by etching at the contact hole CN and connection terminal portions.

Figure 15:
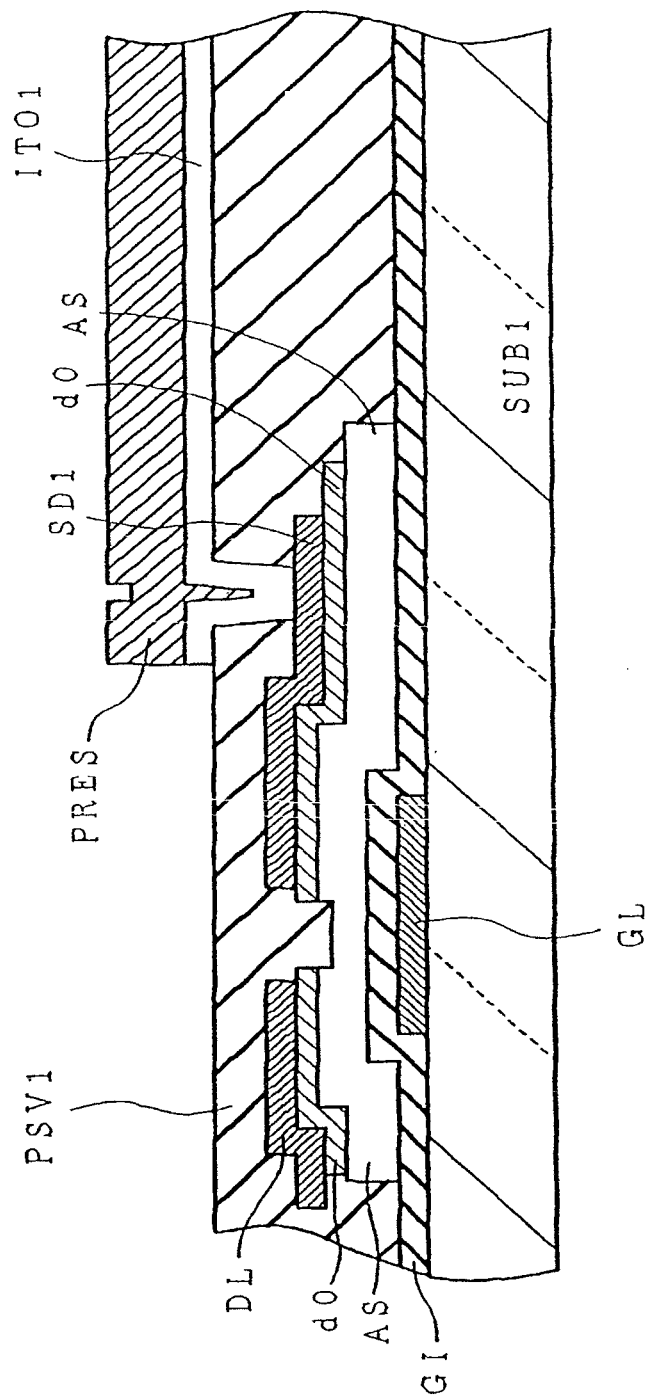
FIG. 15 is a sectional view of a liquid crystal display device corresponding to a step F in FIG. 9.

Step F (FIG. 15)

A second conductive film d2 made of ITO is formed by sputtering. A mask of another photoresist PRES is formed in a specified pattern on the second conductive film d2, and the second conductive film d2 is selectively etched to form a pattern of the pixel electrode ITO1 and the like.

According to the present invention, as described above, the semiconductor layers AS, d0, in addition to the gate insulator GI, interposed between the light-blocking film SKD and the data line DL are shielded from light illumination and function as insulators, and further increases a distance between the light-blocking film SKD and the data line DL, and an electrostatic coupling between the light-blocking film SKD and the data line DL is reduced, so that an electrostatic coupling between the data line DL and the pixel electrode ITO1 by way of the light-blocking film SKD is decreased, resulting in the reduced cross talk.

The present invention thus can provide a liquid crystal display device capable of a display of higher brightness due to higher aperture ratio, of high contrast and low cross talk.

Also, the present invention can provide an inexpensive liquid crystal display device in which a TFT substrate constituting a display panel can be made in a simple process including five photolithography process steps, and a method of making the same.

Additionally, the present invention can provide a liquid crystal display device capable of higher manufacturing yield by preventing open line defects of a conductive film made of ITO at a step caused by the underlying layer.

What we claim is:

1. A display device comprising:
   a substrate;
   a pair of gate lines formed over the substrate;
   a first insulating film formed over the substrate;
   a data line formed over the first insulating film;
   a thin film transistor including a semiconductor layer comprising an i-type semiconductor and an impurity doped semiconductor laminated over the first insulating film, a first electrode formed over the semiconductor layer, and a second electrode formed by a part of the data line;
   a second insulating film formed over the data line and the thin film transistor;
   a third electrode formed over the second insulating film, and overlapped with one of the pair of gate lines; and
   a transparent conductive film, being coupled to the data line via an opening formed in the second insulating film,
   wherein the transparent conductive film, extending from the opening, includes a first portion, and none of the first insulating film and the second insulating film exist between the substrate and the first portion, and
   wherein, in a cross section of an end portion of the first electrode in a direction of a length of a channel of the thin film transistor, the impurity doped semiconductor is configured to extend a minimum distance of 0.2 µm beyond the first electrode in the direction of the length of the channel, and the i-type semiconductor is configured to extend beyond the impurity doped semiconductor in the direction of the length of the channel.

2. A display device according to claim 1,
   wherein the third electrode is transparent.

3. A display device according to claim 2,
   wherein the third electrode is comprised of indium-tin-oxide and overlaps an end portion of the first electrode.

4. A display device according to claim 2,
   wherein the i-type semiconductor and the impurity-doped semiconductor are in contact with each other in the neighborhood of the channel of the thin film transistor.

5. A display device according to claim 2,
   wherein, in the cross section of the end portion of the first electrode in the direction of the length of the channel, the impurity-doped semiconductor is configured to extend a distance of 0.2 µm to 0.7 µm beyond the first electrode in the direction of the length of the channel.

6. A display device according to claim 1, further comprising liquid crystal layer,
   wherein the thin transistor, the second insulating film and the third electrode are disposed between the substrate and the liquid crystal layer.

7. A display device according to claim 6,
   wherein the third electrode is transparent.

8. A display device according to claim 7,
   wherein the i-type semiconductor and the impurity-doped semiconductor are in contact with each other in the neighborhood of the channel of the thin film transistor.

9. A display device according to claim 7,
   wherein, in the cross section of the end portion of the first electrode in the direction of the length of the channel, the impurity-doped semiconductor is configured to extend a distance of 0.2 µm to 0.7 µm beyond the first electrode in the direction of the length of the channel.

10. A display device according to claim 1,
    wherein the third electrode is overlapped with the pair of gate lines.

11. A display device according to claim 10,
    wherein the third electrode is transparent.

12. A display device according to claim 11,
    wherein the third electrode is comprised of indium-tin-oxide and overlaps an end portion of the first electrode.

13. A display device according to claim 12,
    wherein the i-type semiconductor and the impurity-doped semiconductor are in contact with each other in the neighborhood of the channel of the thin film transistor.

14. A display device according to claim 12,
    wherein, in the cross section of the end portion of the first electrode in the direction of the length of the channel, the impurity-doped semiconductor is configured to extend a distance of 0.2 µm to 0.7 µm beyond the first electrode in the direction of the length of the channel.

15. A display device according to claim 10, further comprising a liquid crystal layer,
    wherein the thin transistor, the second insulating film, and the third electrode are disposed between the substrate and the liquid crystal layer.

16. A display device according to claim 15,
    wherein the third electrode is transparent.

17. A display device according to claim 16,
    wherein the i-type semiconductor and the impurity-doped semiconductor are in contact with each other in the neighborhood of the channel of the thin film transistor.

18. A display device according to claim 16,
    wherein, in the cross section of the end portion of the first electrode in the direction of the length of the channel, the impurity-doped semiconductor is configured to extend a distance of 0.2 µm to 0.7 µm beyond the first electrode in the direction of the length of the channel.

* * * * *